United States Patent [19]

Carr et al.

[11] Patent Number: 4,504,789
[45] Date of Patent: Mar. 12, 1985

[54] EQUIPMENT FOR TESTING ELECTRICAL DEVICES SUCH AS SOLENOIDS

[75] Inventors: Edward H. Carr, Stockton-on-Tees; Harry W. Knight, Darlington; Richard C. Turnock, Billingham, all of England

[73] Assignee: Imperial Chemical Industries PLC, Great Britain

[21] Appl. No.: 366,351

[22] Filed: Apr. 7, 1982

[30] Foreign Application Priority Data

Apr. 9, 1981 [GB] United Kingdom ............... 8111143

[51] Int. Cl.³ .................... G01R 31/02; G01R 31/32
[52] U.S. Cl. .................................. 324/418; 324/423; 340/309.15; 340/516
[58] Field of Search ............... 324/415, 418, 422, 423; 340/516, 520, 309.15

[56] References Cited

U.S. PATENT DOCUMENTS 3,150,319  9/1964  Hofferber ........................... 340/516
3,598,146  8/1971  Robin et al. ....................... 340/520

FOREIGN PATENT DOCUMENTS 2251472  4/1974  Fed. Rep. of Germany .
2353660  7/1977  Fed. Rep. of Germany .

Primary Examiner—Michael J. Tokar
Assistant Examiner—Kevin D. O'Shea
Attorney, Agent, or Firm—Cushman, Darby & Cushman

[57] ABSTRACT

Equipment is provided to test an electrical device, e.g. solenoid, or heater that effects an operation, e.g. movement of a valve, heating etc. To perform a test, the equipment actuates the device to cause the operation to commence. When the operation has proceeded to a predetermined extent, or after a predetermined time, whichever occurs first, a signal is produced which causes de-actuation of the device thus stopping the operation. A signal is also produced to indicate whether it was the elapse of the specified time or the operation proceeding to the specified extent that caused de-actuation. The equipment is particularly suited for testing a device forming part of a trip system.

11 Claims, 3 Drawing Figures

EQUIPMENT FOR TESTING ELECTRICAL DEVICES SUCH AS SOLENOIDS

This invention relates to test equipment and in particular to equipment for testing an electrical device of the type wherein changing the electrical state of the device from a first condition to a second condition causes an operation to commence, and restoration of the first condition causes said operation to stop.

Examples of such devices include electro-mechanical devices such as solenoids, contactor coil switches, and electric motors. Changing the electrical state thereof, e.g. energising a solenoid or switching on a motor causes an operation, e.g. movement of a member actuated by the electro-mechanical device, to commence, while restoration of the electrical state to the original condition e.g. de-energising the solenoid or switching off the motor causes said operation to stop. In the case of a solenoid or contactor coil switch, restoration of the original electrical state may cause the operation to reverse, e.g. as a result of spring pressure, to restore the member to its original position. A solenoid or contactor coil switch may of course be operated in the reverse manner, i.e. de-energising causes the movement as a result of spring pressure while re-energising causes restoration of the member to its original position.

Another type of device comprises an electric heater; switching on, or off, causes the amount of heat supplied to material heated by the heater to change with consequent change in e.g. the temperature or rate of volatilisation of the material.

In a factory or plant, e.g. a chemical plant, it is often desirable to check the functioning of devices of the type described without unduly interrupting the operations of the factory or plant. Thus it may be desirable to check that devices such as heaters or electro-mechanical devices operating safety mechanisms such as brakes, relief valves and the like are functioning correctly without full actuation thereof. Thus it may be desired to check the functioning of electrical circuits and also to check that the mechanical movement of a member actuated by an electro-mechanical device has not become unduly sluggish, e.g. as a result of excessive friction.

By the present invention we provide equipment suitable for such testing. The equipment works on the principle of actuating the device, so as to cause the operation, e.g. movement or heating, to commence, if the device is functioning correctly, resetting the device back to its original condition after a predetermined period of time, or prior to this time if the operation has proceeded to a predetermined extent, and providing an indication of whether the operation has proceeded to the predetermined extent prior to elapse of said predetermined period of time.

A suitable period is selected at the end of which resetting of the device must automatically occur irrespective of whether or not the operation has proceeded to the predetermined extent; for example in the case of a heater, whether or not the temperature of the material subject to the heater has changed by a specified amount, or, in the case of an electro-mechanical device, whether or not a member has moved a specified distance, e.g. a proportion of its normal range of travel, or has performed a specified number of revolutions in the case of an electric motor.

This time period is selected so that, if the device is functioning correctly, the operation proceeds to the predetermined extent, for example, in the case of a member actuated by a solenoid, 10% of its normal range of travel, and then the device is restored to its original electrical state, stopping the operation, before the time period has elapsed.

The period, and the predetermined extent of the operation, can generally be set to be sufficiently short that the testing procedure has negligible effect on the normal functioning of the apparatus, e.g. plant, embodying the device.

Accordingly the present invention provides equipment for testing an electrical device of the type wherein changing the electrical state of the device from a first condition to a second condition causes an operation to commence, and restoration of the first condition causes said operation to stop, comprising (i) means for changing said electrical state from the first condition to the second condition, so as to cause said operation to commence, (ii) means responsive to said operation to generate a first signal when said operation has proceeded to a predetermined extent, (iii) timer means for producing a second signal at a predetermined period of time after changing said electrical state from said first condition to said second condition, (iv) means, responsive to the first of said signals to occur, to restore the electrical state of said device to the first condition, and (v) means to indicate which signal caused restoration of the electrical state to said first condition.

The equipment may provide a malfunction indication if the second signal, i.e. the signal from the timer, is produced before the first signal, i.e. the signal generated when the operation has proceeded to the predetermined extent: for example, in the case of an electro-mechanical device such as a solenoid such a malfunction indication would thus occur if the member actuated by the solenoid fails to move at all, e.g. is seized, and so no first signal is produced.

In one form of the equipment according to the invention the timer means produces signals at intervals equal to the predetermined period and the equipment includes (i) a change-over device having input means; output means; actuator means to which the timer signals are applied; and reset means operated by the signal from the means responsive to the operation indicative that the operation has proceeded to the predetermined extent; the output of said change-over device changing from a first output state to a second output state, provided a signal applied to said input means has changed from a first input state to a second input state, upon receipt of a signal applied to said actuator means, and said output reverting to said first output state (a) provided that the signal applied to said input means has reverted to said first input state, upon receipt of a subsequent signal applied to said actuator means, or (b) upon operation of said reset means; the electrical state of the electrical device being in the first condition when said output is in said first output state and in said second condition when said output is in said second output state; (ii) means to provide a signal to said input means; (iii) start means to change the signal applied to said input means from said first input state to said second input state, whereby receipt by said actuation means of the next signal from the timer means after operation of said start means causes said change-over device to actuate so as to change its output from said first output state to said second output state; and (iv) means for resetting said signal applied to said input means, after said output has changed from said first output state to said second output state but before production of the next actuation signal from said timer means, so that receipt of (c) said next actuation signal or (d) a reset signal, causes said output to revert to said first output state thereby causing said electrical state of said electrical device to revert to said first condition thus causing the operation to cease.

In a preferred arrangement, the above equipment is modified by the inclusion of switch means in one position of which the changing of the output of said change-over device from said first to second output states, and vice-versa, has no effect upon the electrical state of the electrical device. By means of such a switch the operation of the test equipment can be tested without actually causing actuation of the electrical device: thus a "dummy" run may be performed prior to an actual test of the electrical device to check that the testing equipment is functioning properly.

The electrical device may be part of a trip system wherein the electrical device operates in the event of some monitored parameter reaching a predetermined value. In such a case it is preferred that means are provided to prevent restoration of the electrical state of the electrical device to the first condition on completion of a test in the event of the monitored parameter reaching the predetermined value during performance of the test.

It is also preferred that the equipment of the present invention, when embodied in a trip system, is arranged so that a test cannot be performed, with consequent resetting of the electrical device, in the event that the trip system is tripped to actuate the electrical device.

To these ends, in the particular form of the equipment described above, it is preferred that the equipment includes disablement means for preventing operation of the starting means from changing the signal to the input means of the change-over device to its second input state if a signal is present from the means responsive to the operation indicative that the operation has proceeded to the predetermined extent. It is further preferred that the equipment includes disablement means for preventing a signal from the means responsive to the operation indicative that the operation has proceeded to the predetermined extent from resetting the change-over device unless the output of said change-over device is in the second output state.

In the particular form of the equipment described above, the means to indicate which signal caused restoration of the electrical state to its first condition preferably comprises (i) a second change-over device having input means; output means; actuator means to which the timer signals are applied; and reset means operated by the signal from the means responsive to the operation indicative that the operation has proceeded to the predetermined extent; the output of said second change-over device changing from a first output state to a second output state, provided that a signal applied to said input means of said second change-over device has changed from a first input state to a second input state, upon receipt of a signal applied to said actuator means of said second change-over device, and said output of said second change-over device only reverting to said first output state upon operation of said reset means; (ii) means to provide a signal to said input means of said second change-over device, operation of the start means causing said signal applied to said input means of said second change-over device to change from said first input state to said second input state so that receipt by said actuation means of said second change-over device of the next signal from the timer means after operation of said start means, causes said second change-over device to actuate so as to change its output from said first output state to said second output state; and (iii) means to provide an indication signal, after the output of said first change-over device has reverted to its first output state, of the output state of said second change-over device.

Where the device is an electro-mechanical device such as a solenoid or contactor coil and is part of a trip system, it is preferred that it is of the fail-safe variety. This may be achieved by providing an energising current to the device when in the normal, i.e. non-tripped, condition and de-energising the device upon receipt of a trip signal.

After the operation has proceeded to the predetermined extent, means are preferably provided, where necessary, to restore the device to its original state. In the case of a fail-safe solenoid, de-energising the solenoid generally permits the desired movement of a member, under spring or other pressure, to occur while re-energising the solenoid causes movement of the member back to its starting position.

The electrical circuits of the equipment of the present invention may, for example, be included on the secondary cards of the trip system described in pending U.S. patent application Ser. No. 366,348, filed on Apr. 7, 1982.

One embodiment of the present invention showing application of the equipment to the testing of a solenoid valve is illustrated by reference to the accompanying circuit diagrams, FIGS. 1–3 wherein FIG. 1 is a block diagram of the overall layout;

Figure 1:
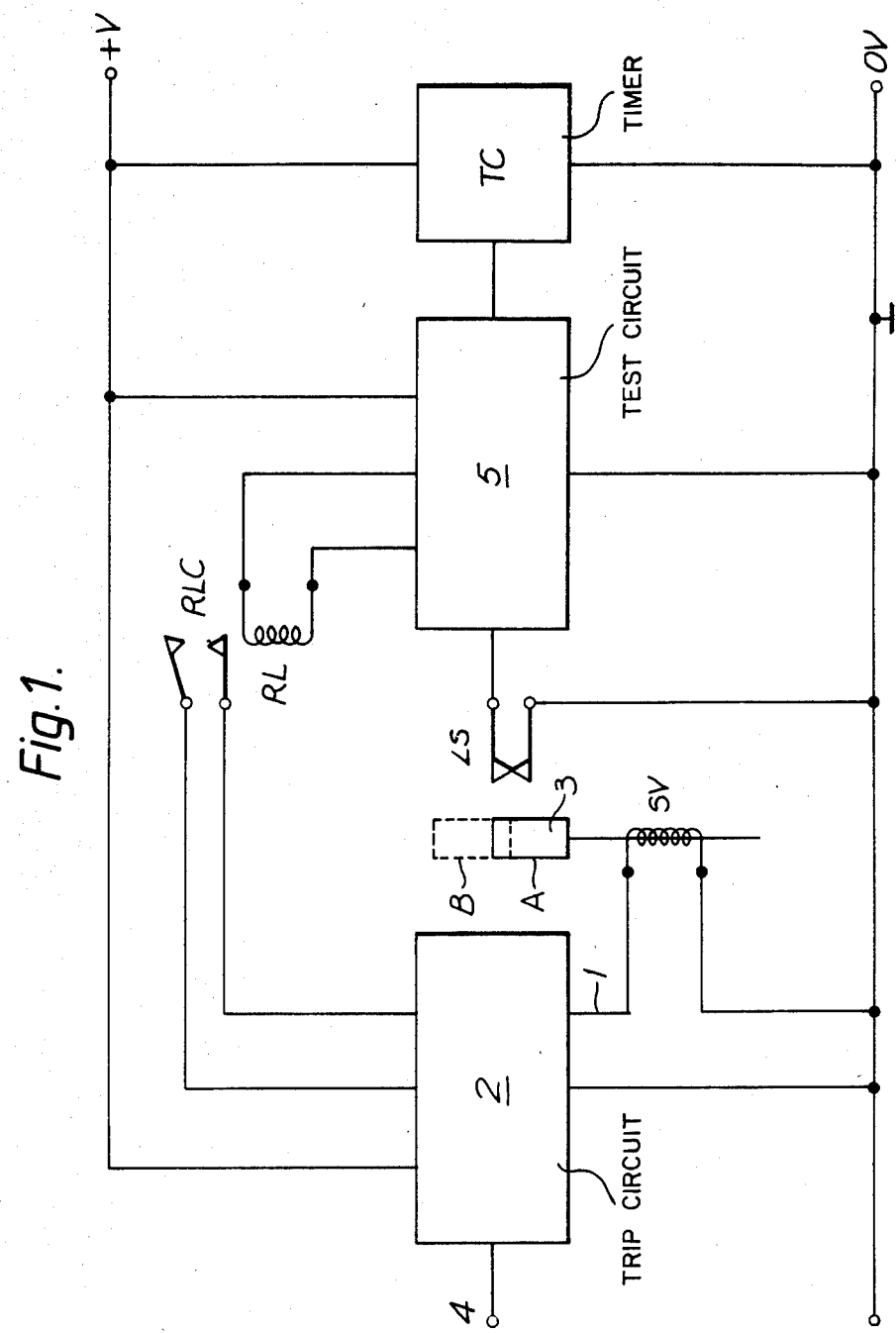

The electrical device is a solenoid valve SV which is normally energised, via the output 1 of a trip circuit 2 (described in more detail hereinafter with reference to FIG. 2), holding a valve operating member 3 in a first position A. Upon de-energisation of the solenoid SV, member 3 moves, e.g. by means of the pressure of a spring (not shown) towards a second position indicated by the dotted line B. A limit switch LS is provided which opens when member 3 reaches a preset position during its travel from A towards B. This preset position is typically 10% of the distance of travel from A to B.

De-energisation of solenoid valve SV is caused by trip circuit 2 upon receipt of a trip signal applied to the input 4 of trip circuit 2. De-energisation of solenoid valve SV may also be brought about by means of a test circuit 5 which is described in more detail hereinafter with reference to FIG. 3. When a test is conducted, test circuit 5 energises a relay RL which causes relay contacts RLC to close to supply a signal to the trip system 2 causing solenoid valve SV to de-energise. Opening of limit switch LS or receipt of a signal from a timer TC de-energises relay RL thus removing the signal to trip circuit 2. Solenoid valve SV is thus re-energised and member 3 is restored to its position A.

Figure 2:
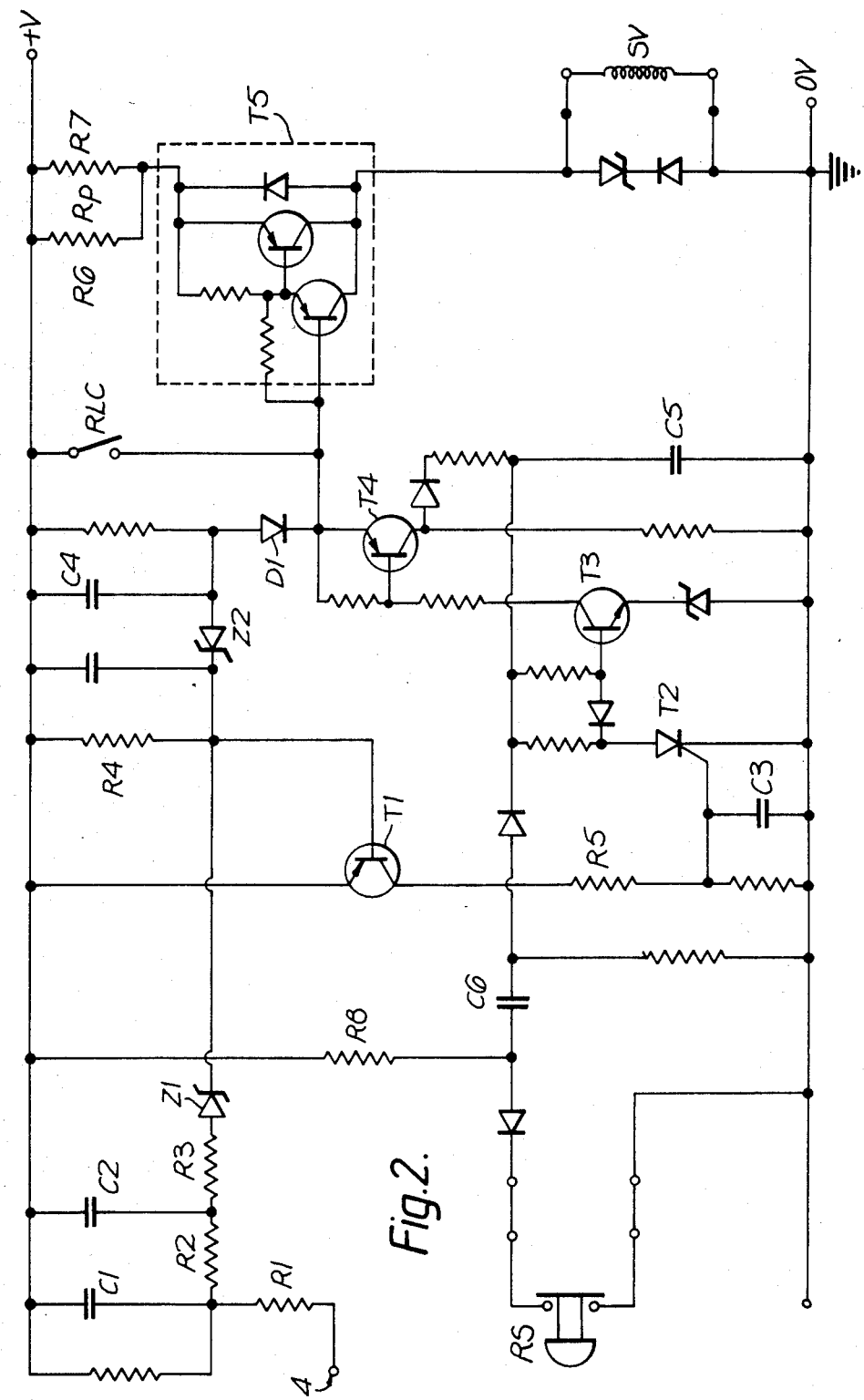
FIG. 2 is a circuit diagram of the trip circuit 2 of FIG. 1.

The trip circuit 2 is shown in FIG. 2 and is arranged to (a) latch 'off' when a trip signal is received by its input 4, (b) latch 'off' if its output current exceeds a certain value, e.g. 5 A, indicative of a short circuit in the output circuit including solenoid valve SV, (c) survive an interruption of supply voltage for up to 250 ms but then to latch 'off' if the interruption continues, and remain latched 'off' when the supply voltage is restored, (d) latch 'on' when it receives a fleeting signal from its reset switch and there is no trip signal at input 4.

In this trip circuit, the trip signal received by input 4 is a reduction in voltage, normally to a value of less than 2 volts, from the normal, i.e. non-tripped, signal which is at the line voltage, typically about 50 volts DC. The input to the trip circuit includes an input filter R1, C1, R2, C2, which requires the input trip signal to persist for nominally 5 ms before latch 'off' occurs. The input filter provides immunity against spurious electrical signals.

As the filter capacitors C1, C2 are charged, the voltage at the junction of R2 and R3 drops with respect to the +V rail. When this voltage reaches 10 volts below the supply voltage, zener diode Z1 conducts and current flows through R3. As the voltage at the junction of R2 and R3 drops further, the current through R3 increases, causing the voltage at the junction of R4 and the base of transistor T1 to fall until transistor T1 conducts.

T1 drives current into the R5, C3 filter at the gate of thyristor T2 which switches on. This filter at the gate is to prevent firing of the thyristor by spurious electrical signals.

T2 conducting clamps the base of transistor T3 to 0 volts and T3 switches off. This removes the base drive to transistor T4 which also switches off. This removes the base drive from the output transistor T5 which, in turn, switches off and de-energises the output to the output circuit containing solenoid SV. T4 switching off also 'starves' thyristor T2 of holding current thereby switching it off.

The circuit is now in a stable latched 'off' condition. Removal of the trip input signal will only remove the gate signal to thyristor T2; this has no effect as T2 has switched off due to lack of holding current.

To provide a latch 'off' when an excessive current passes through the solenoid valve SV, two 1 ohm resistances R6, R7, connected in parallel, provide a resistance Rp of about 0.5 ohm in line with the output of T5. As the current through solenoid valve SV, and hence through T5, increases, the potential difference across Rp (i.e. R6, R7) increases which causes the voltage at the base of T5 to drop.

As the potential difference across Rp increases, current will start to flow through R4, Z2, D1 causing the voltage at the junction of R4 and the base of T1 to fall until T1 is switched on. This causes the output to latch 'off' in the same way as would a trip input signal.

In the event of the output being short circuited, C4 limits the rate of rise of current through T5 by diverting its base current as the voltage at the base of T5 falls. This continues until T5 current reaches 5 amps; D1, Z2 and T1 then conduct enough to switch on T2 and the output is latched 'off' in the usual way. The time delay in this mode is about 250–300 micro seconds; this is long enough to prevent spurious operation of the overcurrent trip, but will not drive T5 into the secondary breakdown area of its operating characteristic.

To provide for interruption in the power supply, C5 provides base current to hold T3 switched on if the supply is interrupted. C5 is sized to allow for an interruption of 250 ms; if the supply interruption lasts longer than this, C5 will become discharged and T3, will switch 'off', causing latching 'off'. If power returns within the 250 ms delay, T3 would remain switched 'on' and would reset T4 and T5 as described hereinafter.

If the output to the solenoid valve SV has been tripped, it is necessary at some later time to reset the trip system.

When the reset switch RS contacts (normally closed) are opened, C6 is charged up via resistance R8 and provides a signal to the base of T3 which starts to conduct. T3 conducting provides base drive to T4 which, switching 'on', provides base drive to T5 and feedback to T3. Thus T4, T3 form a positive feedback loop and rapidly latch themselves 'on'. T5 then has a continuous base drive and the output is latched 'on'.

Once C6 is fully charged, no further signal can be coupled through it to T3, thus the reset switch must be closed again before it can re-operate. This ensures that, if the reset switch or its connections has gone open circuit, reset will not automatically occur when the trip signal that causes the latching 'off' is removed.

If the solenoid valve SV is latched 'on' and the reset switch RS is operated, there is no effect since T3 is already switched on.

This reset action must only occur when:

(a) there is no applied input trip signal, and
(b) the reset switch RS is operated.

If there is an input trip signal, T2 can conduct and prevent the reset action.

When a test actuation of solenoid valve SV is required, relay RL (FIGS. 1 and 3) is energised closing the relay contacts RLC (FIGS. 1 and 2) to connect the base of T5 to the line voltage. T5 thus switches off, de-energising solenoid valve SV, for as long as the relay contacts RLC are closed, i.e. for as long as relay RL is energised.

In the event of a trip signal occurring while the test is taking place, T3 and T4 latch 'off' as described above so that, on opening the relay contacts RLC at the end of the test, T5 remains switched off thus preventing re-energising of solenoid SV until the trip signal disappears and the reset switch RS is actuated.

Figure 3:
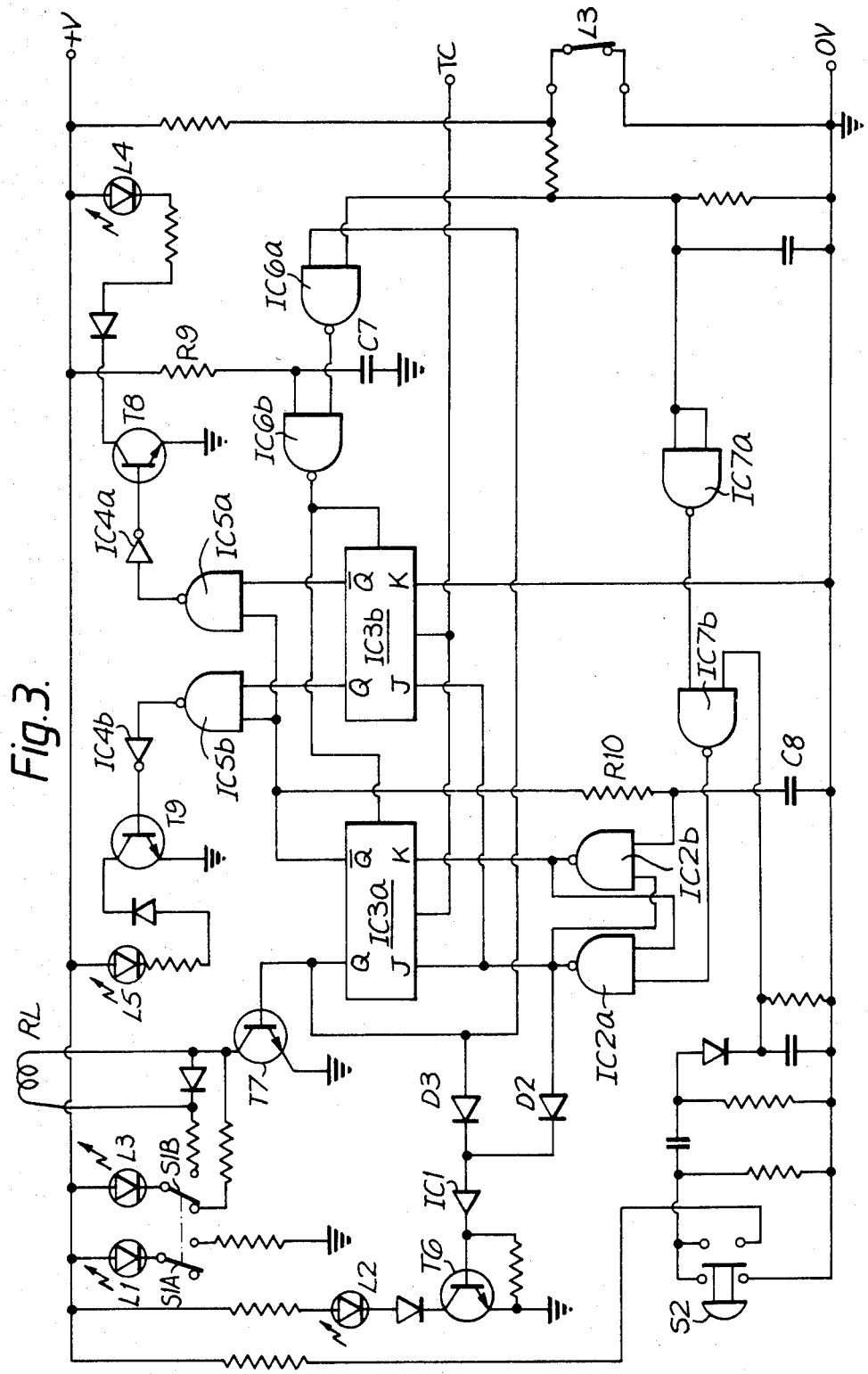
FIG. 3 is a circuit diagram of the test circuit 5 of FIG. 1.

The test circuit 5 is shown in FIG. 3. In the following description, 0 is used to denote a low input or output while 1 denotes a high input or output.

In this embodiment the change-over devices are 'JK flip-flops' which, upon receipt of a reset signal, each have 0, 1 Q and $\bar{Q}$ outputs.

While in this embodiment the JK flip-flop forming the first change-over device is arranged to function in the normal manner, i.e. so that a 0,1 J,K input state gives a 0,1 Q,$\bar{Q}$ output state upon receipt of an actuating signal from the timer and, correspondingly a 1,0 Q,$\bar{Q}$ output with a 1,0 J,K input state, the JK flip-flop forming the second change-over device is partially disabled by keeping the K input at 0 so that the J,K inputs are either 1,0 or 0,0. Because of this, the 0,1 Q,$\bar{Q}$ output state is only achieved upon receipt of the reset signal.

A series of light emitting diodes (LED's) L1–5 are provided to indicate the progress of the test. 'Arm' LED L1 is switched 'on' or 'off' by means of one pole S1A of an 'arm'/'disarm' double pole switch. In the 'arm' position relay RL will be energised, via the other pole S1B, when a test is running while, when in the 'disarm' position, as shown in FIG. 3, a 'dummy run' test may be carried out to check the functioning of the test circuit 5.

LED's 2–5 are each switched 'on' or 'off' by a transistor.

The base drive of transistor T6 controlling 'start' LED L2 is supplied from a non-inverting amplifier IC1, fed (a) via diode D2, from the output of a NAND gate IC2a, which together with a second NAND gate IC2b, forms a bistable supplying the J,K inputs to a JK flip-flop IC3a, forming the first change-over device, and (b), via diode D3, from the Q output of flip-flop IC3a.

The base drive of transistor T7 controlling 'run' LED L3 is supplied by the Q output of IC3a.

The base drives of transistors T8 and T9 controlling the 'satisfactory', i.e. 'OK', and 'malfunction', i.e. '$\overline{OK}$', LED's L4 and L5 respectively, are supplied, via inverting amplifiers IC4a and IC4b from the output of NAND gates IC5a and IC5b respectively. The inputs to IC5a are the $\overline{Q}$ of the flip-flop IC3a and the $\overline{Q}$ output of a second JK flip-flop IC3b forming the second change-over device. The output of NAND gate IC2a provides the J input to IC3b, while, as mentioned hereinbefore, the K input to IC3b is maintained at 0 by grounding the K input. The inputs to IC5b are the $\overline{Q}$ output of IC3a and the Q output of IC3b.

When open, the limit switch LS causes a 1 input to be applied to a NAND gate IC6a. The other input to IC6a is the Q output of IC3a. The output of IC6a provides one input to a NAND gate IC6b. The other input of IC6b is taken from the junction of a resistance R9 and a capacitor C7 connected in series across the supply. The output of IC6b provides the reset signal to the flip-flops IC3a and IC3b.

When open, the limit switch LS also causes 1 inputs to a NAND gate IC7a whose output provides one input to a NAND gate IC7b. The other input to IC7b is provided by a 'start' button S2. The output of IC7b provides the actuating IC2a input of the bistable IC2a, IC2b. The actuating IC2b input of the bistable is taken from the junction of a resistance R10 and capacitor C8 connected in series between the $\overline{Q}$ output of IC3a and the OV rail.

At initial switch on, because of the time taken to charge C7 and C8 via R9 and R10 respectively, 0 inputs are applied to NAND gates IC6b and IC2b. The 0 input to IC2b sets the bistable IC2a, IC2b to give 0,1 outputs respectively.

The 0 input to IC6b gives a 1 output providing a reset signal to the flip-flops IC3a and IC3b which are therefore each set to the Q, $\overline{Q}$ output state of 0,1 irrespective of their J,K inputs.

After C7 and C8 have charged, the inputs to IC6b and IC2b become 1,1 and 0,1 respectively, and the states of the flip-flops, NAND gates and LED's 2–5 are as follows, assuming limit switch LS is closed:

| flip-flop | J | K | Q | $\overline{Q}$ |
|---|---|---|---|---|
| IC3a | 0 | 1 | 0 | 1 |
| IC3b | 0 | 0 | 0 | 1 |

| NAND gate | input | input | output |
|---|---|---|---|
| IC2a | 1 | 1 | 0 |
| IC2b | 0 | 1 | 1 |
| IC5a | 1 | 1 | 0 |
| IC5b | 1 | 0 | 1 |
| IC6a | 0 | 0 | 1 |
| IC6b | 1 | 1 | 0 |
| IC7a | 0 | 0 | 1 |
| IC7b | 1 | 0 | 1 |

| LED | indication | state |
|---|---|---|
| 2 | 'start' | 0 |
| 3 | 'run' | 0 |
| 4 | 'OK' | 1 |
| 5 | '$\overline{OK}$' | 0 |

These states, as will be shown hereinafter, result after any 'satisfactory', i.e. 'OK' test.

The timer TC provides pulses at intervals equal to the desired predetermined period and these pulses are used to actuate the flip-flops IC3a, IC3b.

If switch S1A, S1B is in the 'disarm' position, as shown in FIG. 3, and limit switch LS is closed, operation of the 'start' button S2 provides a momentary 1 input to IC7b thus giving a 0 output which is fed to IC2a causing the outputs of the bistable to change to 1,0 respectively. The 1 signal from the output of IC2a is fed, via diode D2, and non-inverting amplifier IC1 to the base of T6 causing the latter to conduct. The 'start' LED L2 is thus illuminated.

The next pulse P1 to occur from timer TC after actuation of the 'start' button S2 actuates flip-flops IC3a and IC3b, which at this stage both have 1,0 J,K inputs, to give 1,0 Q,$\overline{Q}$ outputs.

The 1 signal of output Q of IC3a maintains the 'started' indication on L2 via diode D3 and also causes T7 to conduct thus illuminating the 'run' LED L3 via the switch S1B. The 1 output Q of IC3a also provides a 1 input to IC6a. The 0 $\overline{Q}$ outputs of IC3a and IC3b cause a 1 output from IC5a thus extinguishing L4 via inverter IC4a and transistor T8. (As will be explained hereafter, at the end of a 'dummy run' or a '$\overline{OK}$' test, L5 is lit: the 0 $\overline{Q}$ output of IC3a at this stage would likewise produce a 1 output on IC5b extinguishing L5 via inverter IC4b and transistor T9).

The Q output $\overline{Q}$ of IC3a also resets the bistable IC2a, IC2b, to the original state (outputs 0, 1 respectively) after a time determined by R10 and C8. This time is longer than the width of the pulse from the timer but is less than the period between pulses.

The next pulse P2 from timer TC to occur after pulse P1 enters the 0,1 outputs from IC2a and IC2b respectively into IC3a which thus returns to its original 0,1 Q,$\overline{Q}$ output state. However, since the J,K inputs of IC3b are now 0,0 pulse P2 has no effect on IC3b which thus retains its 1,0 Q,$\overline{Q}$ output. The input to IC5b thus becomes 1,1 giving an output of 0 thus illuminating the 'malfunction', '$\overline{OK}$' LED L5. At the same time the 0 output of IC2a and the 0, Q output of IC3a cause the 'started' LED L2 to extinguish. Also the 0 Q output IC3a causes the 'run' LED L3 to extinguish. The only LED illuminated is thus the '$\overline{OK}$' LED L5. The 0 Q output of IC3a also disables IC6a so that IC6a keeps a 1 output irrespective of whether limit switch LS subsequently opens.

Thus the various LED's 2–5 have illuminated, and extinguished, in the sequence A:
 (i) 'OK' lit,
 (ii) 'OK' lit, 'started' lit,
 (iii) 'started' lit, 'run' lit,
 (iv) '$\overline{OK}$' lit.
thus showing that the test circuit is functioning correctly. On subsequent 'dummy runs', unless the 'dummy run' follows an 'OK' test, the LED's illuminate in the sequence B:
 (i) '$\overline{OK}$' lit,
 (ii) '$\overline{OK}$' lit, 'started' lit, (iii) 'started' lit, 'run' lit,
(iv) 'OK' lit A 'dummy run' following an 'OK' test would give sequence A.

To perform an actual test, the 'arm/'disarm' switch S1A, S1B is then switched to the 'armed' position. In this position the 'armed' LED L1 is lit. When the "start" button S2 is operated, the test action is repeated, but this time relay RL operates and the solenoid valve SV de-energises during the time that the 'run' LED L3 is illuminated.

When solenoid valve SV de-energises, member 3 will move towards the tripped position (position B in FIG. 1) and operate the limit switch LS. If limit switch LS opens before pulse P2 from timer TC occurs, an input 1 is applied to IC6a. The other input of IC6a has the value 1 from output Q of IC3a and so IC6a gives a 0 output which is fed to IC6b, which thus assumes a 1 output, providing a reset signal to the flip-flops IC3a and IC3b. IC3a and IC3b are thus each reset to their original 0,1 Q,Q̄ output states, irrespective of their J,K input states, extinguishing the 'run' LED L3 (and de-energising relay RL). Provided the bistable IC2a, IC2b has reset to the 0,1 output state (the values of R10 and C8 are selected so that bistable IC2a, IC2b is reset well before the expected normal opening of the limit switch in an 'OK' test), the 'started' LED L2 will also extinguish. Resetting of each flip-flops IC3a and IC3b to the 0,1 Q,Q̄ output state causes IC5a to have a 0 output thus illuminating the 'OK' LED L4. IC6a is also disabled by the 0 Q output from IC3a.

De-energising relay RL causes the trip circuit to restore the current to solenoid valve SV thus returning member 3 to its position A, closing limit switch LS. The closing of limit switch LS restores the inputs of IC6a and IC7a to the 0, 0 state in readiness for another test.

If the limit switch LS contacts do not open before pulse P2 occurs, the test finishes as described above in relation to the dummy run test, with 'OK' LED L5 illuminated. Since, on receipt of pulse P2, IC6a is disabled by the 0 Q output of IC3a, subsequent opening of the limit switch LS does not give a reset signal to IC3a and IC3b.

If the limit switch LS contacts are open before the test is started, 1, 1 inputs are applied to IC7a. This disables IC7b by providing an 0 input thereto and so prevents the 'start' pulse produced by operation of button S2 from giving an 0 output from IC7b and hence prevents an 0 input reaching IC2a.

Therefore, unless the conditions for a test are correct, i.e.
(a) solenoid valve SV energised,
(b) limit switch LS closed, and its cabling correct,
(c) the timer is producing pulses, and
(d) switch S1A, S1B is in the 'armed' position,
an actual test cannot be undertaken.

The time interval between pulses P1 and P2 should be preset to accommodate an acceptable rate of response of the means, e.g. member 3 actuating limit switch LS, responsive to the operation, e.g. movement of member 3. Typically time intervals of between 0.25 and 10 seconds may be employed.

We claim:
1. Equipment for testing an electrical device of the type wherein changing the electrical state of the device from a first condition to a second condition causes an operation to commence, and restoration of the first condition causes said operation to stop, comprising

(i) means for changing said electrical state from the first condition to the second condition, so as to cause said operation to commence,
(ii) means responsive to said operation to generate a first signal when said operation has proceeded to a predetermined extent,
(iii) timer means for producing a second signal at a predetermined period of time after said electrical state changes from said first condition to said second condition,
(iv) means, responsive to the first of said signals to occur, to restore the electrical state of said device to the first condition, and
(v) means to indicate which signal caused restoration of the electrical state to said first condition.

2. Equipment according to claim 1 wherein the timer means produces signals at intervals equal to the predetermined period and comprising
(i) a change-over device having input means; output means; actuator means to which the timer signals are applied; and reset means operated by the signal from the means responsive to the operation indicative that the operation has proceeded to the predetermined extent; the output of said change-over device changing from a first output state to a second output state, provided a signal applied to said input means has changed from a first input state to a second input state, upon receipt of a signal applied to said actuator means, and said output reverting to said first output state (a) provided that the signal applied to said input means has reverted to said first input state, upon receipt of a subsequent signal applied to said actuator means, or (b) upon operation of said reset means; the electrical state of the electrical device being in the first condition when said output is in said first output state and in said second condition when said output is in said second output state;
(ii) means to provide a signal to said input means;
(iii) start means to change the signal applied to said input means from said first input state to said second input state, whereby receipt by said actuation means of the next signal from the timer means after operation of said start means causes said change-over device to actuate so as to change its output from said first output state to said second output state; and
(iv) means for resetting said signal applied to said input means, after said output has changed from said first output state to said second output state but before production of the next actuation signal from said timer, so that receipt of (c) said next actuation signal or (d) a reset signal, causes said output to revert to said first output state thereby causing said electrical state of said electrical device to revert to said first condition thus causing the operation to cease.

3. Equipment according to claim 2 including disablement means for preventing operation of the starting means from changing the signal to the input means of the change-over device to its second input state if a signal is present from the means responsive to the operation indicative that the operation has proceeded to the predetermined extent.

4. Equipment according to claim 2 including disablement means for preventing a signal from the means responsive to the operation indicative that the operation has proceeded to the predetermined extent from resetting the change-over device unless the output of said change-over device is in the second output state.

5. Equipment according to claim 2 wherein the means to indicate which signal caused restoration of the electrical state to its first condition comprises
   (i) a second change-over device having input means; output means; actuator means to which the timer signals are applied; and reset means operated by the signal from the means responsive to the operation indicative that the operation has proceeded to the predetermined extent; the output of said second change-over device changing from a first output state to a second output state, provided that a signal applied to said input means of said second change-over device has changed from a first input state to a second input state, upon receipt of a signal applied to said actuator means of said second change-over device, and said output of said second change-over device only reverting to said first output state upon operation of said reset means;
   (ii) means to provide a signal to said input means of said second change-over device, operation of the start means causing said signal applied to said input means of said second change-over device to change from said first input state to said second input state so that receipt by said actuation means of said second change-over device of the next signal from the timer means after operation of said start means, causes said second change-over device to actuate so as to change its output from said first output state to said second output state; and
   (iii) means to provide an indication signal, after the output of said first change-over device has reverted to its first output state, of the output state of said second change-over device.

6. Equipment according to claim 1 wherein the electrical device forms part of a trip system wherein said electrical device operates in the event of a monitored parameter reaching a predetermined value.

7. Equipment according to claim 6 including means to prevent restoration of the electrical state of the electrical device to the first condition on completion of a test in the event of the monitored parameter reaching the predetermined value during performance of the test.

8. Equipment according to claim 1 wherein the timer means produces signals at intervals equal to the predetermined period and comprising
   (i) a change-over device having input means; output means; actuator means to which the timer signals are applied; and reset means operated by the signal from the means responsive to the operation indicative that the operation has proceeded to the predetermined extent; the output of said change-over device changing from a first output state to a second output state, provided a signal applied to said input means has changed from a first input state to a second input state, upon receipt of a signal applied to said actuator means, and said output reverting to said first output state (a) provided that the signal applied to said input means has reverted to said first input state, upon receipt of a subsequent signal applied to said actuator means, or (b) upon operation of said reset means;
   (ii) switch means having an armed position and a disarmed position, whereby, when said switch means is in the armed position the electrical state of the electrical device is in the first condition when said output is in said first output state and in said second condition when said output is in said second output state, and, when said switch means is in the disarmed position, the changing of the output of said change-over device from said first to second output states, and vice-versa, has no effect upon the electrical state of the electrical device;
   (iii) means to provide a signal to said input means;
   (iv) start means to change the signal applied to said input means from said first input state to said second input state, whereby receipt by said actuation means of the next signal from the timer means after operation of said start means causes said change-over device to actuate so as to change its output from said first output state to said second output state; and
   (v) means for resetting said signal applied to said input means, after said output has changed from said first output state to said second output state but before production of the next actuation signal from said timer, so that receipt of (c) said next actuation signal or (d) a reset signal, causes said output to revert to said first output state thereby causing, when said switch means is in the armed position, said electrical state of said electrical device to revert to said first condition thus causing the operation to cease.

9. Equipment according to claim 8 including disablement means for preventing operation of the starting means from changing the signal to the input means of the change-over device to its second input state if a signal is present from the means responsive to the operation indicative that the operation has proceeded to the predetermined extent.

10. Equipment according to claim 8 including disablement means for preventing a signal from the means responsive to the operation indicative that the operation has proceeded to the predetermined extent from resetting the change-over device unless the output of said change-over device is in the second output state.

11. Equipment according to claim 8 wherein the means to indicate which signal caused restoration of the electrical state to its first condition comprises
   (i) a second change-over device having input means; output means; actuator means to which the timer signals are applied; and reset means operated by the signal from the means responsive to the operation indicative that the operation has proceeded to the predetermined extent; the output of said second change-over device changing from a first output state to a second output state, provided that a signal applied to said input means of said second change-over device has changed from a first input state to a second input state, upon receipt of a signal applied to said actuator means of said second change-over device, and said output of said second change-over device only reverting to said first output state upon operation of said reset means;
   (ii) means to provide a signal to said input means of said second change-over device, operation of the start means causing said signal applied to said input means of said second change-over device to change from said first input state to said second input state so that receipt by said actuation means of said second change-over device of the next signal from the timer means after operation of said start means, causes said second change-over device to actuate so as to change its output from said first output state to said second output state; and
   (iii) means to provide an indication signal, after the output of said first change-over device has reverted to its first output state, of the output state of said second change-over device.

* * * * *